(12) United States Patent
Bruce et al.

(10) Patent No.: US 8,219,964 B2
(45) Date of Patent: Jul. 10, 2012

(54) METHOD FOR CREATING ELECTRICALLY TESTABLE PATTERNS

(75) Inventors: James A. Bruce, Essex Junction, VT (US); Edward W. Conrad, Essex Junction, VT (US); Jacek G. Smolinski, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 12/687,147

(22) Filed: Jan. 14, 2010

(65) Prior Publication Data

US 2011/0173586 A1 Jul. 14, 2011

(51) Int. Cl.
*G06F 17/50* (2006.01)
(52) U.S. Cl. ............ 716/136; 716/119; 716/52; 716/112
(58) Field of Classification Search ............... 716/50–56, 716/112, 119, 136
See application file for complete search history.

(56) References Cited

U.S. PATENT DOCUMENTS

| | | | |
|---|---|---|---|
| 6,279,147 B1 * | 8/2001 | Buynoski et al. | 430/5 |
| 6,380,556 B1 | 4/2002 | Bang et al. | |
| 6,787,800 B2 | 9/2004 | Weiland et al. | |
| 7,174,521 B2 | 2/2007 | Stine et al. | |
| 7,187,179 B1 | 3/2007 | Scaman et al. | |
| 7,356,800 B2 | 4/2008 | Stine et al. | |
| 7,373,625 B2 | 5/2008 | Stine et al. | |
| 7,418,694 B2 * | 8/2008 | Kobayashi et al. | 716/50 |
| 7,434,197 B1 * | 10/2008 | Dolainsky et al. | 716/53 |
| 7,644,388 B1 * | 1/2010 | Daldoss et al. | 716/52 |
| 2005/0229130 A1 | 10/2005 | Wu et al. | |
| 2006/0282814 A1 | 12/2006 | Percin et al. | |
| 2007/0006116 A1 | 1/2007 | Percin et al. | |
| 2007/0210306 A1 | 9/2007 | Molinelli Acocella et al. | |

OTHER PUBLICATIONS

Niedermaier et al., "Structural failure prediction using simplified lithography simulation models", Design for Manufacturability through Design-Process Integration, Proc. of SPIE, vol. 6251, pp. 652107-1-652107-8 (2007).
Marz et al., "Hardware Verification of Litho-Friendly Design (LfD) Methodologies", Design for Manufacturability through Design-Process Integration, Proc. of SPIE, vol. 6251, pp. 65210M-1-65210M-9 (2007).
Bruce et al., "Predicting Yield using Model Based OPC Verification—Calibrated with Electrical Test Data," Design for Manufacturability through Design-Process Integration II, Proc. of SPIE, vol. 6925, pp. 69250S-1-69250S-10, (2008).

* cited by examiner

*Primary Examiner* — Jack Chiang
*Assistant Examiner* — Brandon Bowers
(74) *Attorney, Agent, or Firm* — Yuanmin Cai; Todd Li

(57) ABSTRACT

The present invention provides a method and computer program product for designing an electrically testable pattern that is based on patterns derived from the desired chip layout to be printed. Such electrical test patterns are based on the features within a region of influence around critical sites. The critical sites may be identified, for example, by processing the chip layout through an OPC verification tool that flags potential failure sites. The electrical test pattern is formed from features within an region of influence (ROI) around the critical site, and also include electrical feed lines at terminal ends of one or more features having an electrical characteristic that is sensitive to changes in the printed environment of the critical site. The feed lines may be locate on the same or a different layer than the critical site, depending on the chip design. The electrical pattern is further defined by retaining features within a second trim region such that the printed features within the ROI are not substantially modified by the absence of features outside the second trim region.

30 Claims, 15 Drawing Sheets

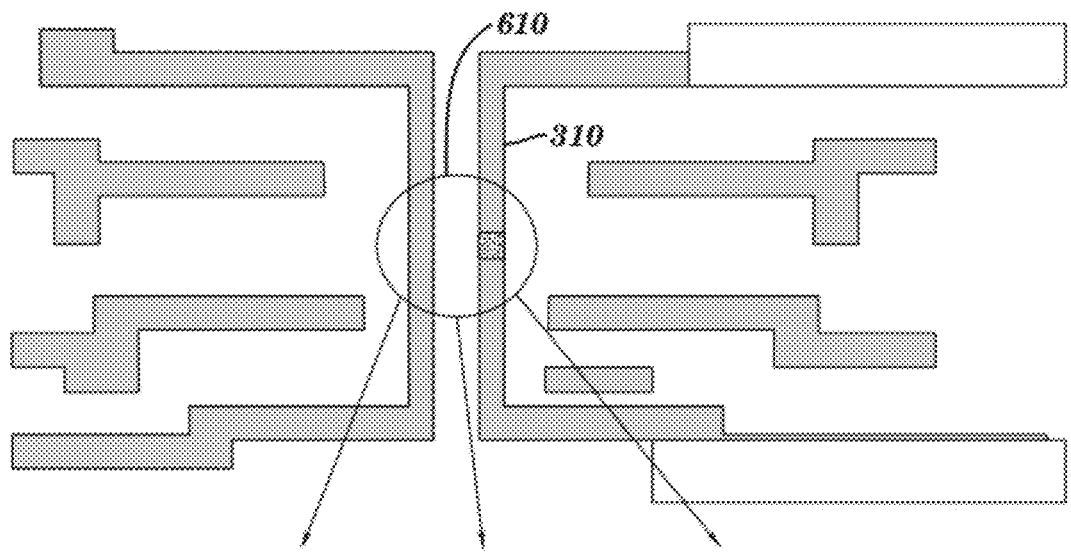
*FIG. 9A*
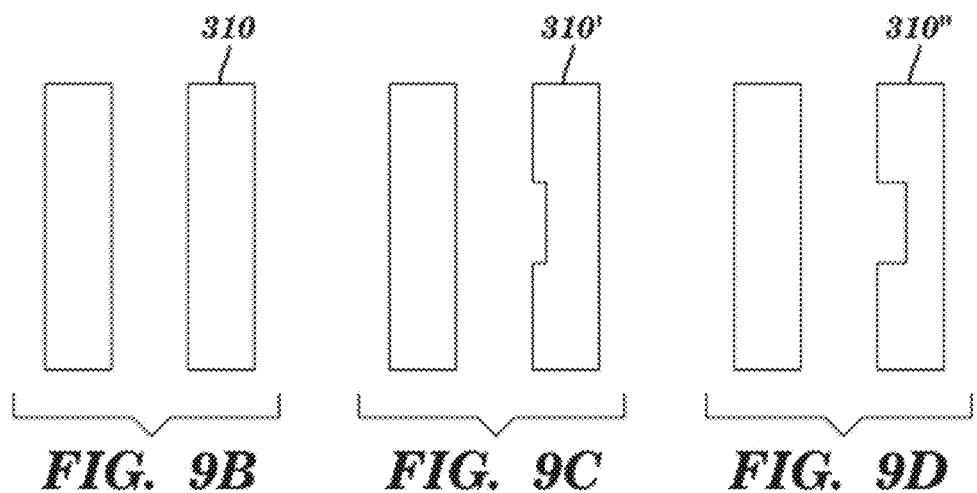
*FIG. 9B*  *FIG. 9C*  *FIG. 9D*

METHOD FOR CREATING ELECTRICALLY TESTABLE PATTERNS

FIELD OF THE INVENTION

The present invention broadly relates to the design of integrated circuits, particularly to the design of lithographic masks, and more particularly to improvements in creating electrically testable patterns for use in monitoring lithographic processes and calibrating lithographic models used in mask design processes such as optical proximity correction (OPC) or in OPC Verification.

BACKGROUND

In the manufacture of integrated circuits, photolithographic processes are commonly used, in which a wafer is patterned by projecting radiation through a patterned mask to form an image pattern on a photo sensitive material, referred to as a photoresist, or simply resist. The exposed resist material is developed to form openings corresponding to the image pattern, and then the pattern is transferred to the wafer substrate by methods such as etching, as known in the art.

The basic lithography system consists of a light source, a photomask containing the pattern to be transferred to the wafer, a collection of lenses, and a means for aligning existing patterns on the wafer with patterns on the mask. The mask design process as described herein covers the steps from chip design, optical proximity correction (OPC), OPC Verification and mask fabrication.

A lithography stepper is limited by parameters described in Rayleigh's equation:

$$R = k_1 \frac{\lambda}{NA} \qquad (1)$$

where $\lambda$ is the wavelength of the light source used in the projection system and NA is the numerical aperture of the projection optics used. $k_1$ is a factor describing how well a combined lithography system can utilize the theoretical resolution limit in practice and can range from 0.8 down to <0.5 for standard exposure systems. The highest resolution in optical lithography is currently achieved with deep ultra violet (DUV) steppers operating at 193 nm wavelength. Steppers operating at wavelengths of 248 and 365 nm are also in widespread use.

Patterning densely spaced geometries, as for example, a static random access memory (SRAM) cell and other process sensitive 2-D geometries for increasingly smaller technologies, e.g. 65 nm technologies or smaller, presents a major challenge. The use of resolution enhancement technologies (RET), such as alternating phase shift mask (altPSM), sub-resolution assist features (SRAFs) and advanced Optical Proximity Correction (OPC), have led to improvements in the design patterns that may be reliably transferred to a wafer. Such mask design processes typically rely on accurate numerical models of the imaging processes, which are herein referred to as lithographic models, which provide predictions of the images produced by various lithographic processes, such as optical imaging and resist processes, as well as images resulting from other processes such as etch and chemical-mechanical polish (CMP) process images.

Such imaging models need to be calibrated, and it is standard practice to print predesigned test patterns to calibrate such models. For example, electrically testable patterns may be used to evaluate the yield of a particular on-wafer process. Such electrical test patterns may be used to monitor the yield of a process and a particular tool. The results of such tests may be used as data points for calibrating lithographic process models.

However, current electrical test patterns are relatively simple, such as serpentine or comb structures, and have been limited in the range of geometries covered, and may not fully represent the range of sensitive patterns that may occur in an actual chip design.

In view of the above, there is a need for a method to provide electrically testable patterns that more reliably reflect actual chip patterns for more reliable process monitoring and model calibration to provide improved prediction of yield.

SUMMARY OF THE INVENTION

The present invention provides a method and computer program product for designing an electrically testable pattern that is based on patterns derived from the desired chip layout to be printed. Such electrical test patterns are based on the features within a region of influence around critical sites. The critical sites may be identified, for example, by processing the chip layout through an OPC verification tool that flags potential failure sites. The electrical test pattern is formed from features within an region of influence (ROI) around the critical site, and also include electrical feed lines at terminal ends outside the ROI of one or more features having an electrical characteristic that is sensitive to changes in the printed environment of the critical site. The electrical pattern is further defined by retaining features within a second trim region such that the printed features within the ROI are not substantially modified by the absence of features outside the second trim region.

According to one aspect of the invention, a method is provided for designing an electrical test pattern comprising the steps of providing a chip design comprising a chip layout of a first layer of features to be printed; identifying a critical site in the chip layout; identifying at least one electrical test feature of the chip layout adjacent the critical site, the at least one electrical test feature having at least one electrical characteristic that will be significantly modified if a printing failure occurs at the critical site; defining a region of influence (ROI) around the critical site such that printing of the critical site will not be influenced more than a predetermined critical site tolerance by the absence of features outside the ROI; defining at least one feed line electrically connected to said at least one electrical test feature to enable testing of said at least one electrical characteristic; defining a trim region outside of the ROI such that the absence of any feature of the chip layout located outside of the trim region will not substantially, within a predetermined ROI tolerance, affect the printed dimensions of any feature within the ROI; and deleting all features, other than said at least one feed line and said at least one electrical test feature, located outside of said trim region to form a customized electrical test pattern.

According to another aspect of the invention, the method further comprises printing the customized electrical test pattern in accordance with a lithographic process to be used to print said chip layout; electrically testing the printed customized electrical test pattern; and if the at least one electrical characteristic fails a predetermined criterion, then modifying the lithographic process.

According to yet another aspect of the invention, the method further comprises simulating a printing of the customized electrical test pattern in accordance with a process model of a lithographic process to be used to print the chip layout; determining a yield metric for the lithographic process based on the simulated printed customized electrical test pattern; printing the customized electrical test pattern in accordance with the lithographic process to be used to print said chip layout; determining the yield metric based on the printed customized electrical test pattern; and calibrating the process model based on a comparison between the printed and simulated yield metric.

According to yet another aspect, the feed lines may be on the same or a different layer than that of the critical site. In the case that a feed line is located on the same layer as the critical site, a feed line trim region is defined around the electrical feed line to ensure that there are no adverse printing effects, such as shorts, from neighboring features to the feed line.

The method according to the invention may be implemented in a computer program product comprising a computer storage medium including computer readable instructions wherein the computer readable instructions when executed on a computer system causes the computer system to perform the method steps of: providing a chip design comprising a chip layout of a first layer of features to be printed; identifying a critical site in the chip layout; identifying at least one electrical test feature of the chip layout adjacent the critical site, the at least one electrical test feature having at least one electrical characteristic that will be significantly modified if a printing failure occurs at the critical site; defining a region of influence (ROI) around the critical site such that printing of the critical site will not be influenced more than a predetermined critical site tolerance by the absence of features outside the ROI; defining at least one feed line electrically connected to said at least one electrical test feature to enable testing of said at least one electrical characteristic; defining a trim region outside of the ROI such that the absence of any feature of the chip layout located outside of the trim region will not substantially, within a predetermined ROI tolerance, affect the printed dimensions of any feature within the ROI; and deleting all features, other than said at least one feed line and said at least one electrical test feature, located outside of said trim region to form a customized electrical test pattern.

The foregoing and other features and advantages of the invention will be apparent from the following detailed description of the invention.

BRIEF DESCRIPTION OF THE DRAWINGS

Referring to the exemplary drawings wherein like elements are numbered alike in the several figures, not necessarily drawn to scale, in which:

FIGS. 9A and 9B-9D illustrate modifications of an electrical test pattern used to form an array of test patterns in accordance with the invention.

DETAILED DESCRIPTION OF THE INVENTION

This invention presents a method for designing customized electrically testable patterns that more accurately represent the most sensitive structures arising from an actual chip design. Such customized electrical test patterns may be used to monitor any lithographic process used to transfer (or equivalently, print) a chip layout to a wafer. The term "lithographic process" as used and referred to herein, includes, without limitation, any pattern transfer process, such as forming a resist image, forming implants, performing a patterned etch, etc.

Figure 1:
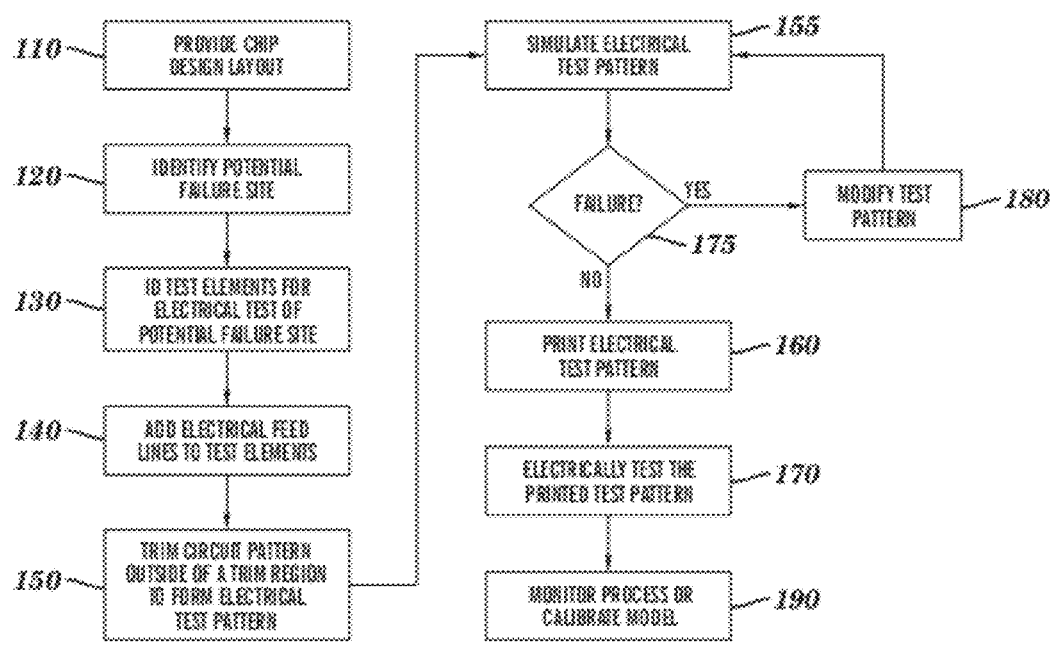
FIG. 1 illustrates a flow chart of an embodiment of a method for designing an electrical test pattern based on a desired chip layout.

One embodiment of a method for designing an electrical test pattern, in accordance with the invention, is illustrated in FIG. 1. First, a chip layout of interest is provided (Block 110). The chip layout may be one of several layers of a chip design, containing a layout of polygons that represent critical features of the chip that are to be printed. Next, potential failure sites, or critical sites, are identified in the chip layout, for example by processing the layout through a tool, such as an OPC Verification tool (Block 120). Then, the feature(s) that may be used to electrically characterize a yield parameter at the critical site are identified (Block 130). For example, if the critical site is located on a critical feature, the electrical continuity of that feature may be used as a yield parameter. In another example, if a critical site is located in a space between two adjacent conductive features, an electrical short between the two adjacent features may be used as a yield parameter. Stated another way, electrical test features are selected such that at least one electrical characteristic will be significantly modified, according to a predetermined threshold, if a printing failure occurs at the critical site. Such nearest neighbor electrical features to the critical site are identified as critical electrical test elements.

Next, a region of influence (ROI) is defined around the critical potential failure site. The ROI is a region within which the features have a significant influence, greater than a predetermined criterion, on the printability of the critical potential failure site. Electrical feed lines are added to the chip layout to enable testing of one or more electrical characteristic of the critical site. In one embodiment, at least one feed line is placed on the same layer of the chip layout in which the critical site is located, and connected to a terminal end of a critical test element outside of the ROI (Block 140). In another embodiment, one or more electrical feed lines are located on a feature on a different layer that is electrically connected to the critical site on the first layer. The electrical feed lines are preferably wider than the electrical test elements. In a preferred embodiment, the width of the feed lines is in the range from about 1.2 to 1.5 times the minimum CD of the test elements.

Next, in Block 150, a trim region is defined extending outward from the ROI, so that the features within the ROI will remain substantially the same without the presence of any features removed outside of the trim region (e.g. within a predetermined criterion, such as 5%). In a preferred embodiment, the boundary of the trim region is at least one ROI from any feature located on the edge of the ROI around the critical potential failure site. Features outside of the trim region, other than any feed lines or electrical test elements, are then removed. In addition, if a feed line is located on the same layer as the critical site, any features that are within a feed line trim region are also removed so as to avoid any shorts to the widened feed lines. In a preferred embodiment, the feed line trim region is defined by a minimum spacing distance from the edges of the feed lines, for example, by $1.2\ S_{min}$, where $S_{min}$ is the minimum design spacing. Alternatively, the minimum spacing could be based on a minimum post-OPC spacing. The trimmed layout pattern with the added feed lines form an electrical test pattern in accordance with the invention.

Next, the electrical test pattern may be verified by simulation (Block 155). If there are any additional defects introduced by the modifications of the original layouts (Block 175), then the test pattern may be modified accordingly (Block 180).

Finally, the electrical test pattern may be printed by the process or processes of interest (Block 160) and electrically tested (Block 170) to monitor the process and/or to calibrate a process model (Block 190).

Figure 2:
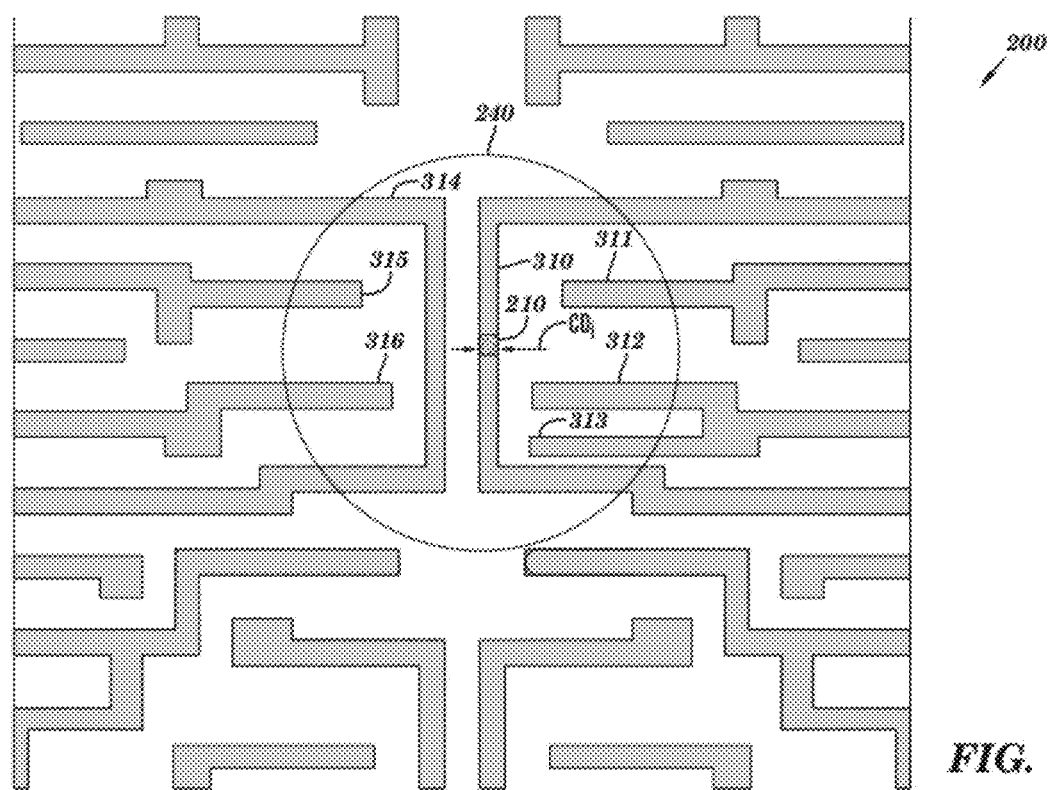
FIG. 2 illustrates critical site identified within a chip layout and a region of influence (ROI) around the critical site.

In one embodiment, referring to FIG. 2, a portion of a chip design layout 200 is provided that typically comprises a two-dimensional layout of polygons that define target features used to form circuits on a chip. An OPC verification tool may identify sites at which potential failures are likely to occur during the printing process. For example, the feature 210 that has a critical dimension ($CD_i$) is identified as being a potential failure site, based on a rule such as, for example, the printed width $CD_i$ of a feature should not be less than a minimum width $CD_{min}$. Other examples of methods for finding potential failure sites include, but are not limited to: 1) measuring the smallest CDs at several different process conditions, e.g. focus or dose, and flagging those sites where the smallest CD is less than a $CD_{min}$; or 2) flagging those sites where the mask error factor (MEEF)>$MEEF_{max}$, where MEEF is a measure of the ratio of the change in printed dimension on the wafer to a corresponding change in mask dimension.

All the polygon features 310-316 located within the optical radius of influence (ROI) around the potential failure site 210 are identified. The ROI is the distance at which a feature located outside the ROI would not substantially affect the printing of the feature at the target site 210. For example, the ROI 240 may be set to be the radius wherein a feature located outside the ROI 240 would influence the size of the printed CD at the critical site by less than 5%.

Another method of determining the ROI is given by the equation:

$$ROI = \frac{\alpha}{\sigma} \frac{\lambda}{NA} \quad (2)$$

where $\sigma$ is the partial coherence of the optical system, NA is the numerical aperture of the optical system, $\lambda$ is the wavelength of the illumination and $\alpha$ is a factor in the range of 2.24 to 10.

In accordance with the present invention, features that are electrically associated with the potential failure or critical site 210 are identified to serve as electrical test elements. The electrical test elements are chosen to have at least one electrical characteristic that will be significantly modified if a printing failure occurs at the critical site 210. In this example, the polygon feature 310 is directly connected to the potential failure site 210, and can be used to test the electrical characteristics of the critical site 210. In this example, the electrical test feature 310 is chosen such that the electrical path between the two electrical feed lines 400 will contain the critical site 210. An electrical characteristic to be tested would be the resistance of the electrical path between the two feed lines 400. Failure of the critical site 210 would be observed when the resistance of the electrical path along the actual printed line 310 exceeded a given threshold value. For example, the threshold value may be a fraction, e.g. 20%, of the resistance expected for a nominally printed line 310 of the same length as the actual printed line between the feed lines 400.

To enable electrical testing of the electrical characteristic at the critical site, electrical feed lines are defined to allow connection of probes and/or wires to the electrical test features. One or more electrical feed lines may be defined on the same layer as the critical site. Alternatively, in the case where the electrical test element is designed to have an electrical connection to a feature on another layer of the chip layout, an electrical feed line may be defined on a different layer. In some cases, all electrical feed lines may be located on a different layer than the layer where the critical site is located.

Figure 3:
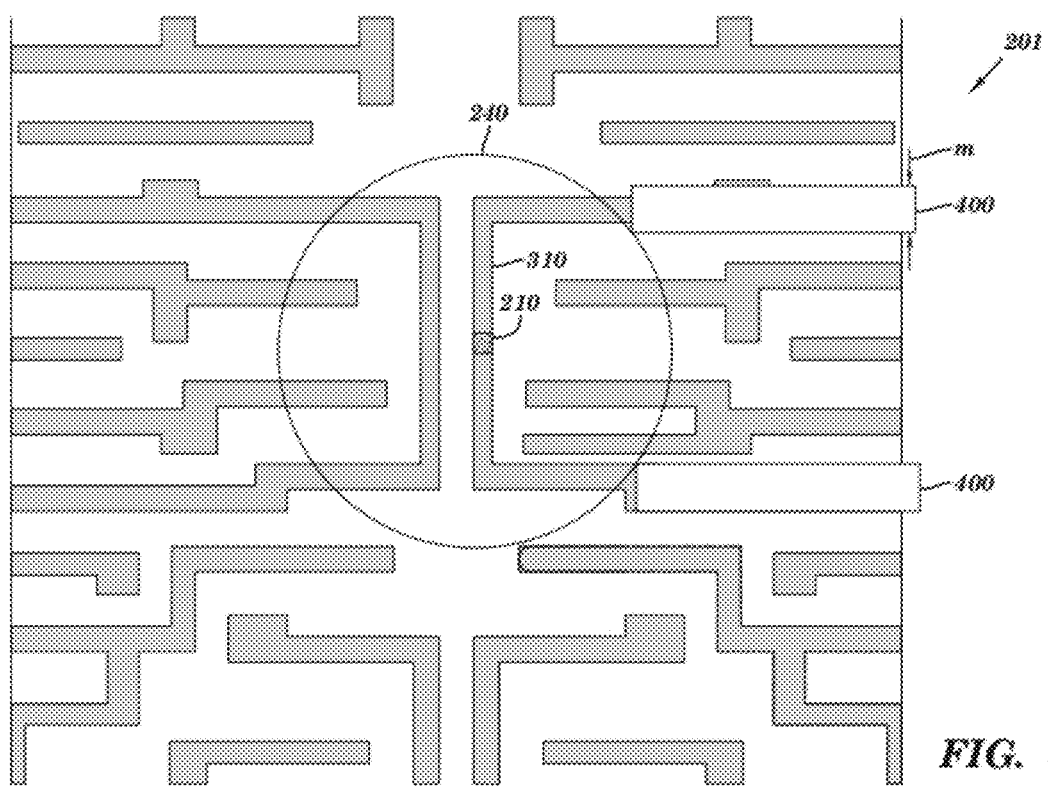
FIG. 3 illustrates feed lines added outside the ROI to electrical test elements associated with the critical site.

In this example, electrical feed lines 400 are provided on the same layer as the critical site 210. Electrical feed lines 400 which are on the same layer as the critical site are located outside of the ROI 240. In this example, the feed lines 400 are located at terminal ends of the electrical test feature 310 outside of the ROI 240. The feed lines 400 are designed such that the feed lines are printable under the process of interest, and in particular, will not themselves contain any potential failure sites. In a preferred embodiment, the feed lines 400 may be designed as rectangles having a uniform width m that is larger than the width of the test element 310. For example, the width m of the feed lines 400 may be defined as a predetermined percent (e.g. 10%) or factor wider than $CD_{min}$. In a preferred embodiment, m ranges from 1.2 $CD_{min}$ to 1.5 $CD_{min}$. The modified layout 201 containing the feed lines 400 is illustrated in FIG. 3. In another embodiment, the feed lines may be formed by outward biasing terminal portions of the feature 310 that lie outside of the ROI 240 by a fixed amount. In another embodiment, if the width of feature 310 is sufficiently wide, the feed lines may comprise terminal portions or extensions of feature 310 outside of the ROI 240.

Figure 4A:
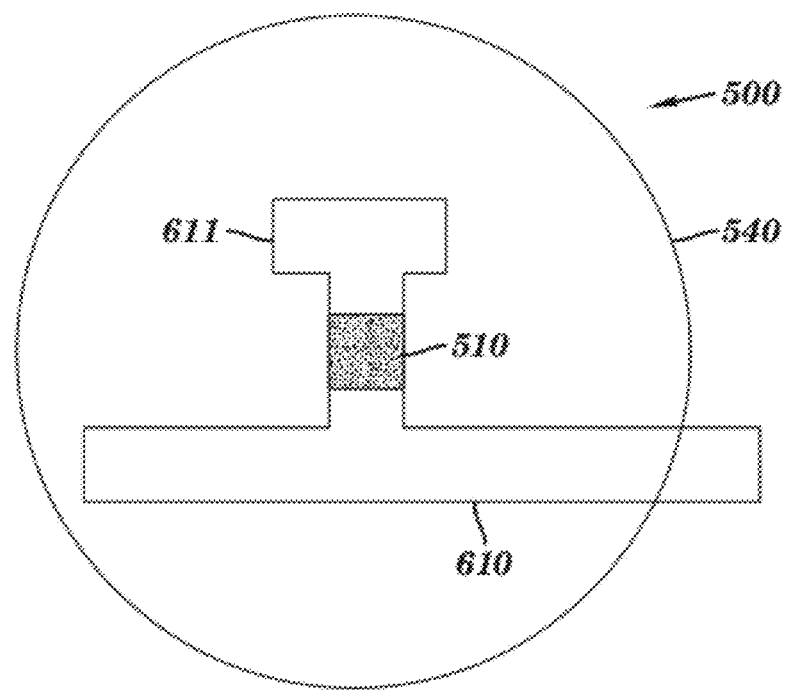
FIG. 4A illustrates another embodiment having critical site identified on a first layer of a chip layout.
Figure 4B:
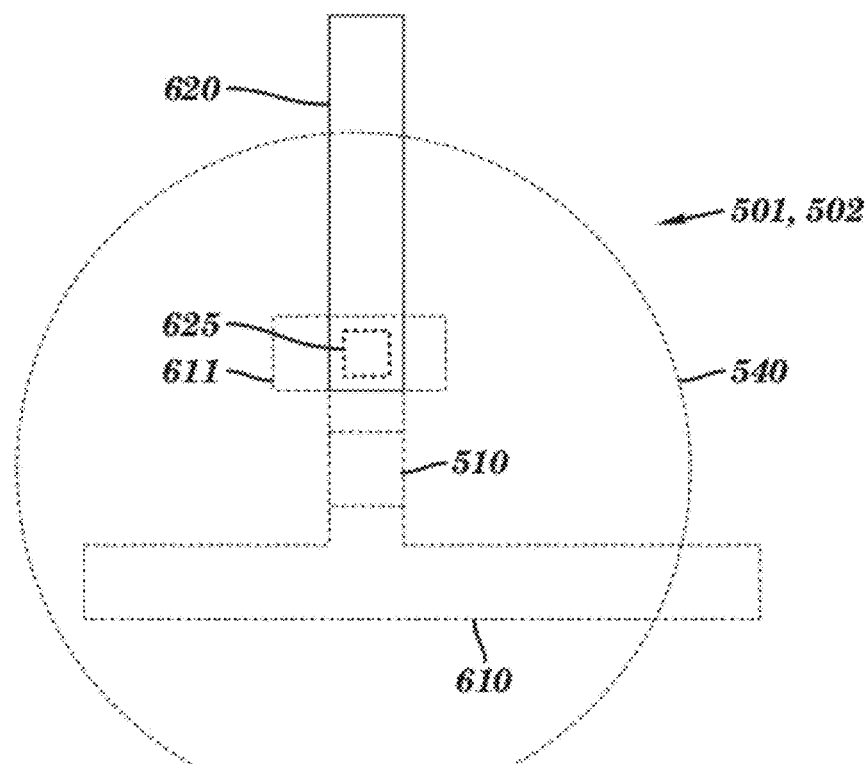
FIG. 4B illustrates a feature on a second layer of a chip layout having an electrical connection to the critical site on the first layer of the chip layout in FIG. 4A.
Figure 4C:
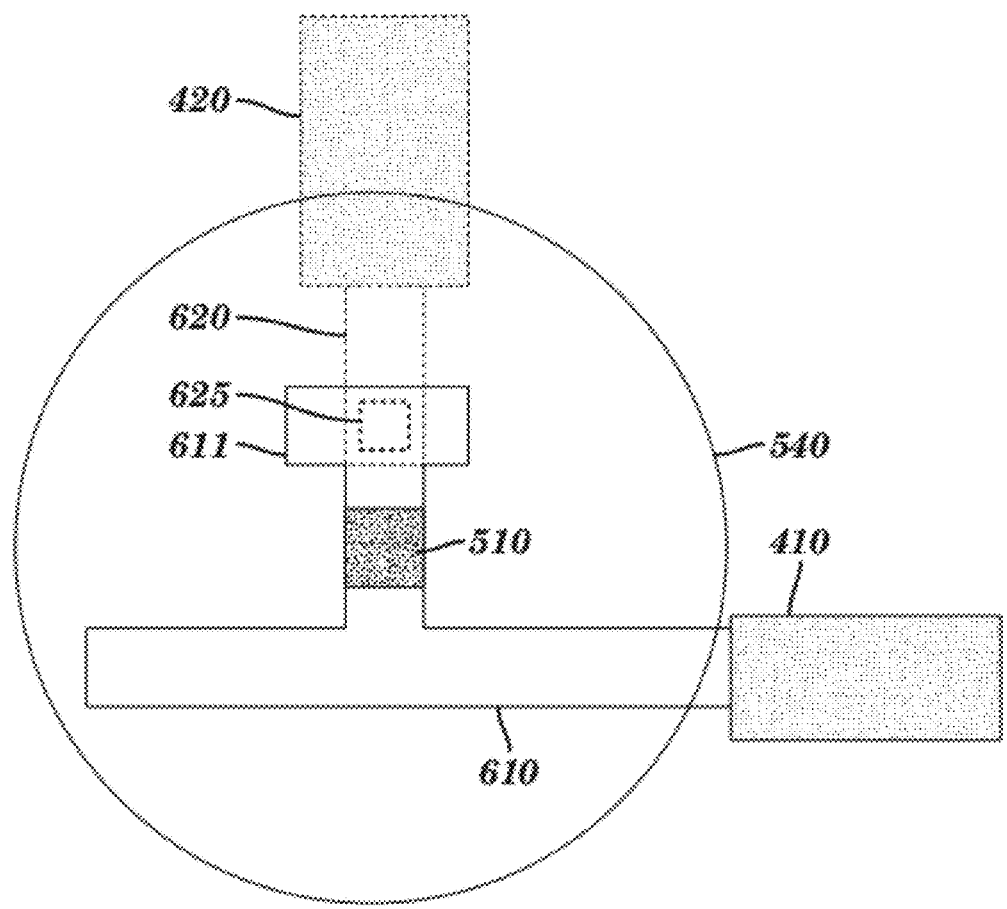
FIG. 4C illustrates an embodiment in which feed lines are added to the first and second layers of the chip layout of FIGS. 4A-4B.

The feed lines need not be located on the same layer as the critical site. Consider a layout 500 having a feature 610 with a critical site 510 illustrated in FIG. 4A. The feature 610 has a landing pad 611 located within the ROI 540. The chip layout also includes a second layer 501 (see FIG. 4B) having a feature 620. The feature 620 is designed to be electrically connected to the landing pad 611 of feature 610 through a via 625 designed on an intermediate via layer 502 disposed between the first layer 500 and the second layer 501. In this example, a feed line 420 may be defined on the second layer 501 at a terminal end of feature 620. In addition, a second feed line 410 is defined on the same layer 500 as the critical site 510 at a terminal end of the feature 610. In accordance with the invention, if the feed line is located on the same layer as the critical site, the feed line is placed outside of the ROI. In this example, the feed line 410 is placed at a terminal end of feature 610 outside of the ROI 540 around the critical site 510. FIG. 4C illustrates an embodiment illustrating the feature 610 including feed line 410 on the first layer 500 overlaid by feature 620 and feed line 420 on the second layer 501 which is electrically connected to the feature 610 through via 625 on the intermediate via layer 502.

Figure 5:
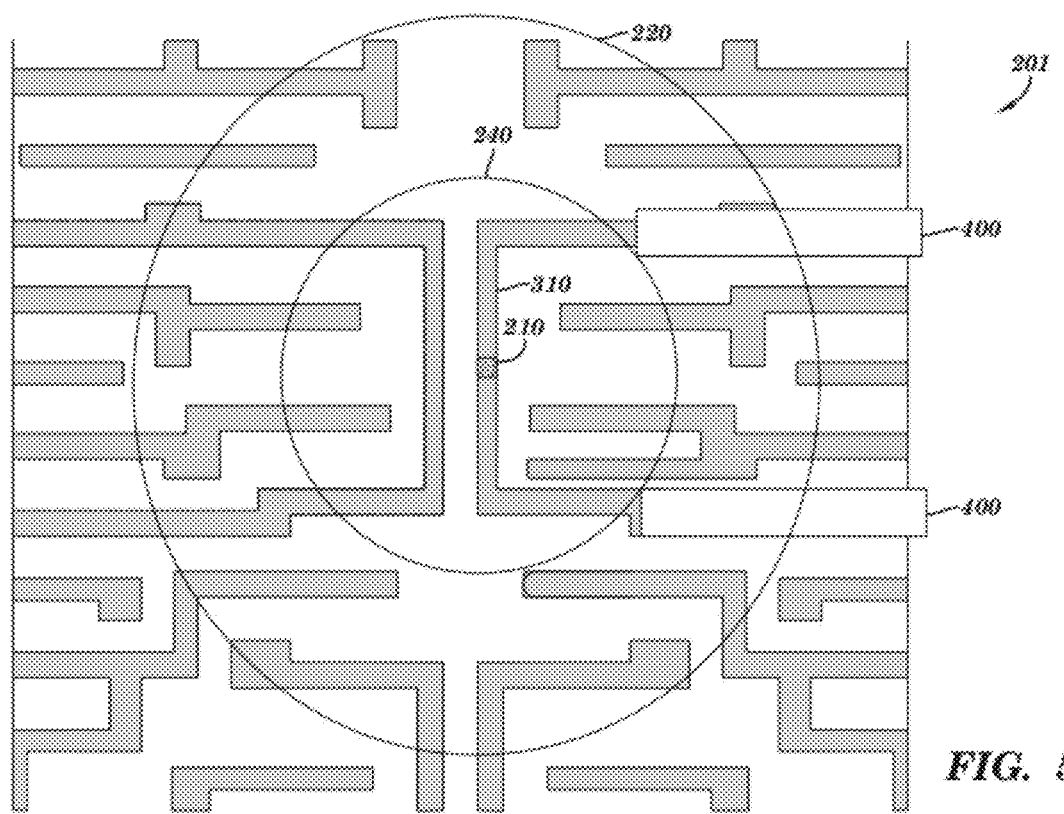
FIG. 5 illustrates a trim region outside of the ROI, in accordance with the present invention.
Figure 6:
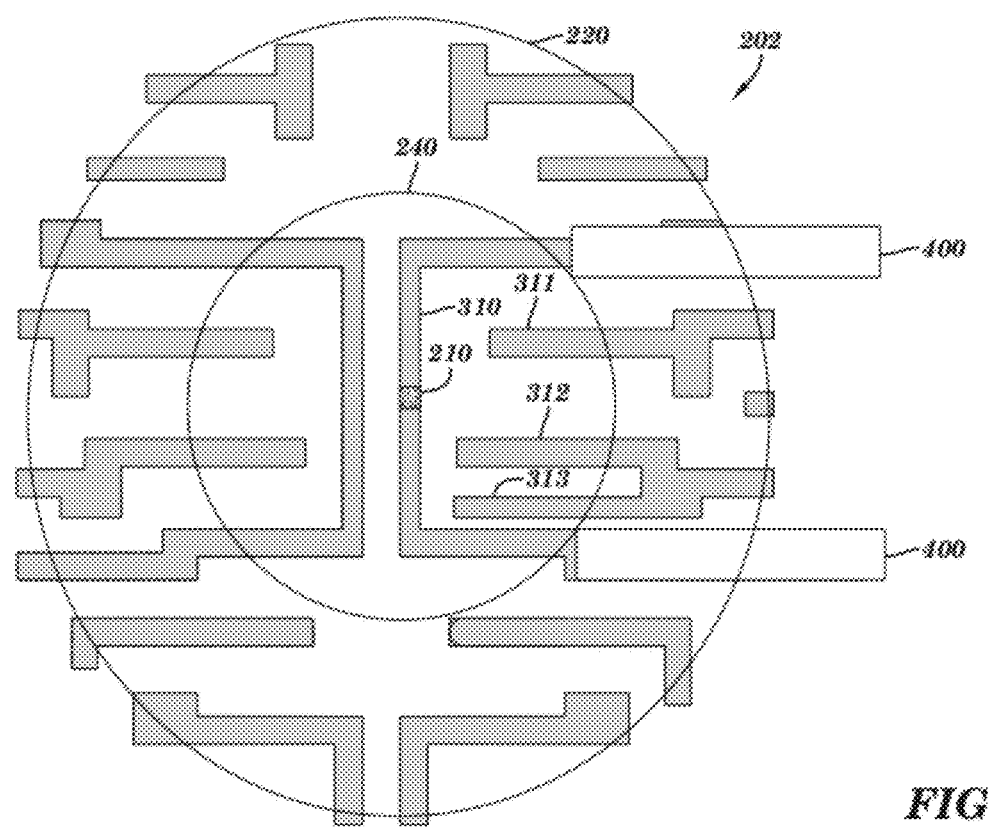
FIG. 6 illustrates an embodiment of an electrical test pattern after deleting features outside of the trim region.

Next, referring to FIG. 5 and continuing the description of the embodiment of FIG. 3, a trim region 220 is defined. The trim region 220 is defined such that any feature outside of the trim region 220 will not substantially (within a predetermined tolerance) affect the printed dimensions of any feature within the ROI 240. For example, the trim region 220 may be defined such that the dimensions of any feature within the ROI 240 do not vary by more than 5% with or without the presence or absence of any feature outside of the trim region 220. In a preferred embodiment, the trim region 220 may be defined to be a region that is at least 1 ROI from any feature on the edge of the ROI region 240. This ensures that the local environment around the critical site 210 and the critical (electrical test element) feature 310 in the resulting test pattern remains essentially the same after trimming. Although the trim region 220 is drawn as a concentric circle around the critical site 210 and the ROI 240, the trim region 220 need not be circular in shape, and the invention is not so limited. All features that are outside the trim region 220, other than the feed lines 400 and the electrical test element 310, are then deleted, or trimmed. In a preferred embodiment, the trimming of features is performed so as to maintain Manhattan geometries, i.e. so that the remaining features have edges that are oriented along orthogonal X-Y directions. In addition, a cleanup of any remaining shapes is performed that would violate any other mask design, inspection and manufacturability rules. The resulting trimmed layout pattern 202 is illustrated in FIG. 6.

Figure 7:
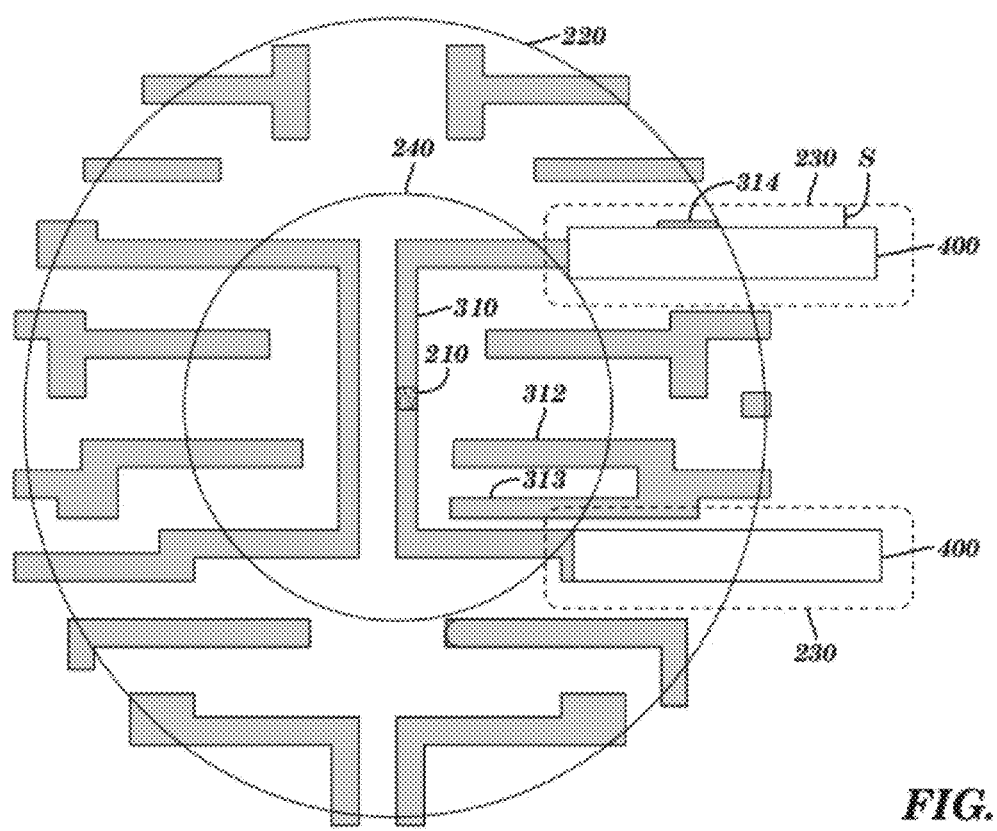
FIG. 7 illustrates a feed line trim regions in accordance with the invention.
Figure 8:
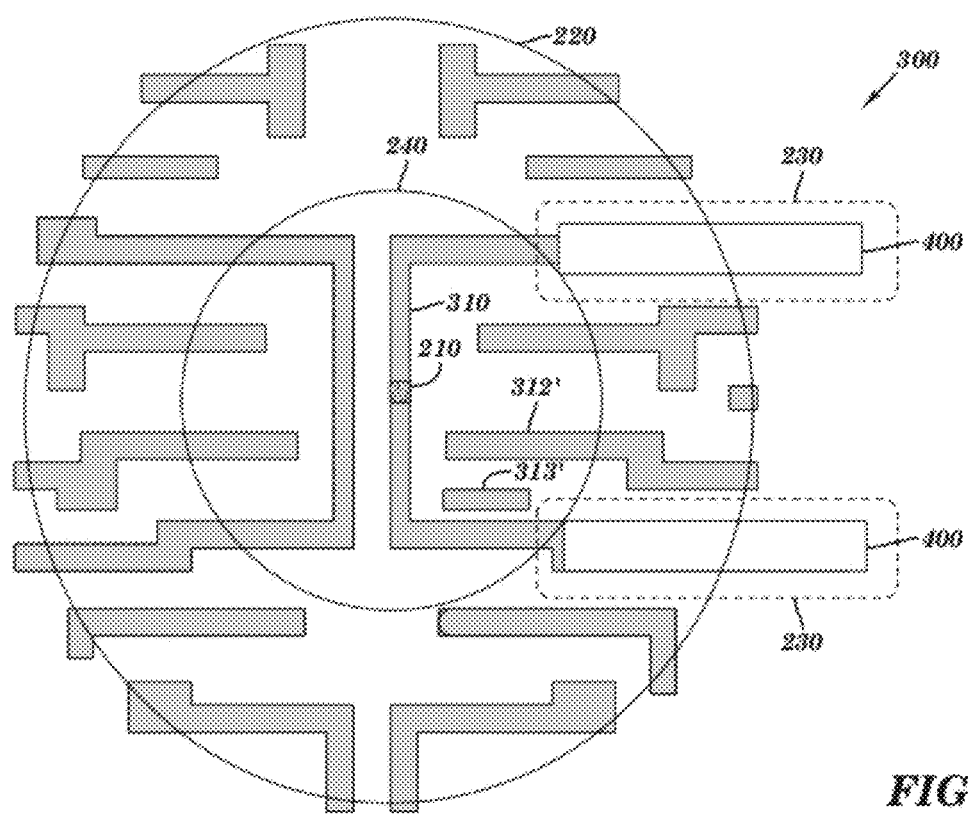
FIG. 8 illustrates an electrical test pattern after trimming around feed lines in one embodiment in accordance with the invention.

Next, referring to FIG. 7, in this example, the feed lines 400 are located on the same layer as the critical site 210. In accordance with the invention, a feed line trim region 230 is defined around each of the electrical feed lines 400 to ensure that there are no adverse printing effects, such as shorts, from neighboring features to the widened feed lines 400. The feed line trim region 230 may be defined as a region having a minimum spacing S extending outward from the edges of the feed lines 400. The minimum spacing S may be based on a minimum space rule $S_{min}$ between printed features, such as a minimum design space. Alternatively, the minimum spacing S may be based on other rules, such as a minimum post-OPC space. The trim region 230 may be defined as a region having a constant distance S from the edges of the feed lines 400. Then, all features other than the feed lines 400 and portions of the feature 310 leading from the feed lines 400 into the ROI 240 are deleted. This prevents shorting of the feed lines 400 to another nearby feature due to decreased spacing between the relatively wide feed line 400 and neighboring features and or shorting caused by changes in the proximity environment for structures adjacent to the feed lines. In this example, the feed lines 400 are designed as rectangular features having width m, and protruding feature 314 and a portion 313 of feature 312 are within the feed line trim region 230. In accordance with the invention, features 314 and 313 that are within the feed line trim region 230 are deleted, removing the protruding feature 314 and leaving modified features 312', 313'. The feed lines 400 may be extended outward from the ROI 240 to connect to test pads. The resulting trimmed pattern 300 is illustrated in FIG. 8.

The resulting trimmed layout 300 forms a customized electrically testable pattern that is based upon the actual chip layout, in accordance with the present invention. In a preferred embodiment, the trimming of features is performed so as to maintain Manhattan geometries, i.e. so that the remaining features have edges that are oriented along orthogonal X-Y directions. A cleanup of any remaining shapes performed that would violate any other mask design, inspection and manufacturability rules.

This electrical test pattern 300 may be simulated using a lithographic process model to verifying that the changes to layout (e.g. addition of features 400) have not created any new potential failure sites. In other words after simulation, site 210 should still have the smallest CD of any portion along line 310/400. If not, then the electrical test pattern 300 can be iteratively modified and re-simulated until output is satisfactory.

Referring to FIG. 9, the electrically testable pattern 300 can be further modified to create a suite of electrical test patterns. For example, within a region 610 that is in close proximity to the potential failure site 210, the dimensions of the features 310 (FIG. 9A) may be systematically modified to form modified features 310' (FIG. 9B) and 310" (FIG. 9C). An array of electrical test patterns may formed, each containing a different modification of the feature 310 containing the critical site 210.

Figure 10:
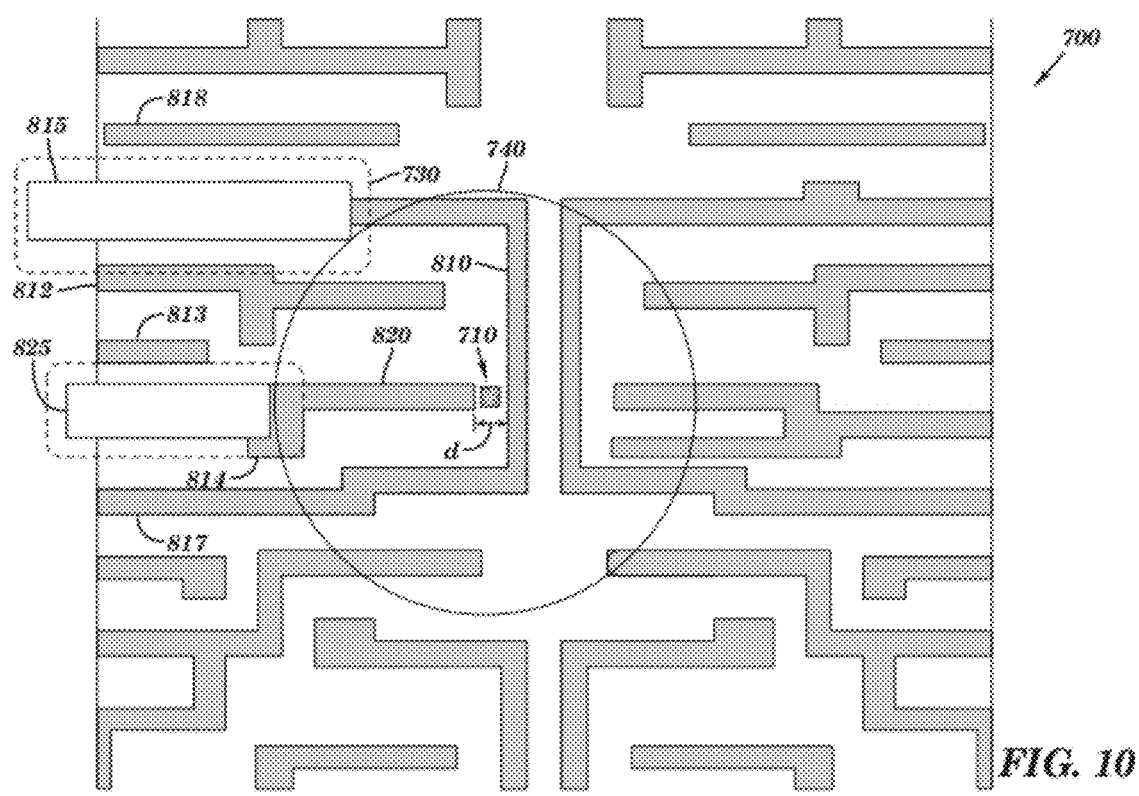
FIG. 10 illustrates a portion of a chip layout having an identified critical site comprising a critical space, including a trim region, rectangular feed lines and feed line trim regions in accordance with the invention.

Another example of an embodiment is illustrated in FIG. 10. Layout 700 is provided, in which a potential failure or critical site 710 is identified based on a space error. For example, the printed space at location 710 is flagged as a potential failure if the space may print with a width less than a minimum space distance d. The ROI 740 is identified around the potential failure site 710, and features that are electrically associated with the critical site 710 are identified as two features that abut the critical space site 710. In this example, features 810 and feature 820 are the nearest neighboring electrically conductive features to the critical space site 710. A space violation at the critical site 710 may cause a short between features 810 and 820. In one embodiment, an electrical characteristic to be tested would be the resistance of the electrical path between two feed lines 815, 825 at the terminal ends of the abutting features 810, 820, respectively. Failure would be observed when the resistance of the electrical path is less than a predetermined threshold value. For example, the threshold value would be a fraction, e.g. 80%, of the resistance expected for nominally printed lines 810, 820.

According to one embodiment, rectangular feed lines 815 and 825 having a constant width larger than the width of features 810 and 820, are defined to terminal ends of features 810 and 820, respectively, outside of the ROI 740. Features 812, 813, 814, 817, 818 are in the neighboring vicinity of the feed lines 815, 825.

Next, a trim region 720 (see FIG. 11) is defined that is at least a distance away from the ROI 740 such that the printing of features within the ROI 740 are not substantially influenced by features outside of the trim region 720. In one embodiment, the trim region 720 is defined to have a boundary at least one ROI from any feature on the edge of the ROI 740. Any feature outside of the trim region 720, other than the feed lines 815, 825 or the electrical test features 810, 820, may be trimmed from the layout. Preferably, the trimming is performed so as to maintain Manhattan geometries (i.e. so that the polygons have edges oriented only along X-Y orthogonal directions).

Figure 11:
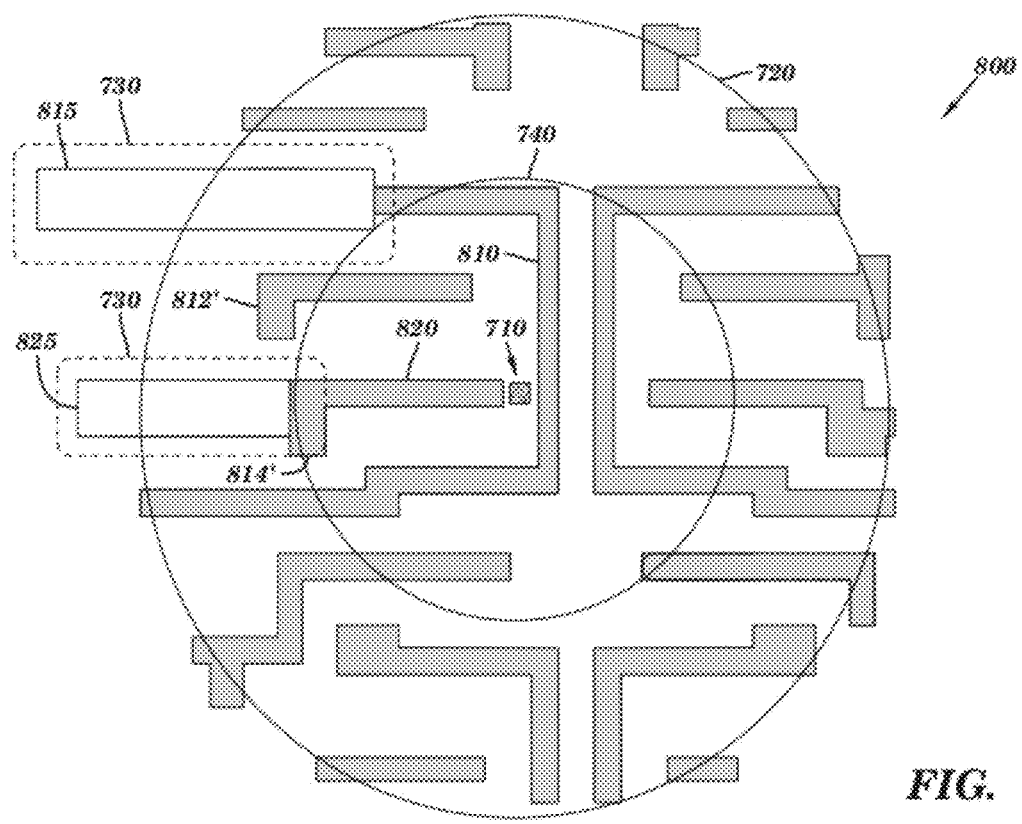
FIG. 11 illustrates an embodiment of an electrical test pattern formed in accordance with the invention based on the modified layout of FIG. 10.

In addition, feed line trim regions 730 are defined around the rectangular feed lines 815, 825 based on a minimum space criterion from the edges of the feed lines 815, 825, and any features within the feed line trim region 730 are deleted to ensure there are no shorts to the feed lines 815, 825. In this example, features 812, 813 and 814 are within the feed line trim region 730. Feature 813 is deleted, and features 812, 814 are modified to form trimmed features 812', 814'. The resulting customized electrical test pattern 800 is illustrated in FIG. 11.

Figure 12:
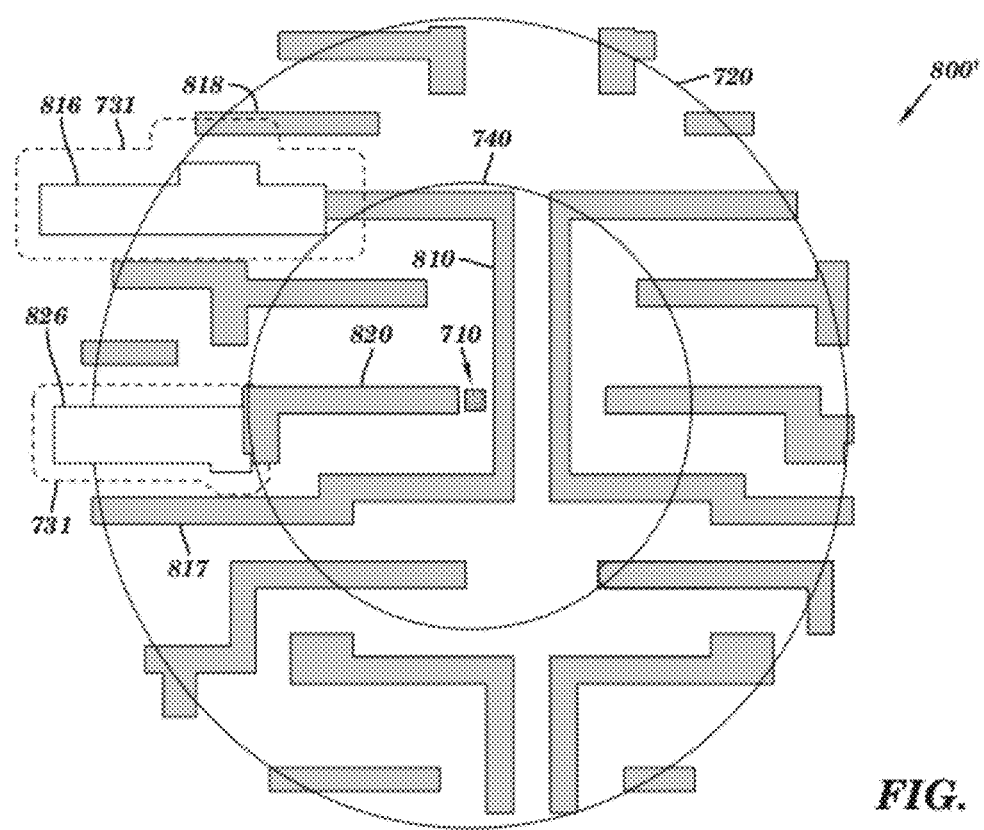
FIG. 12 illustrates an embodiment based on the layout of FIG. 10, using biased feed lines and feed line trim regions formed in accordance with the invention.
Figure 13:
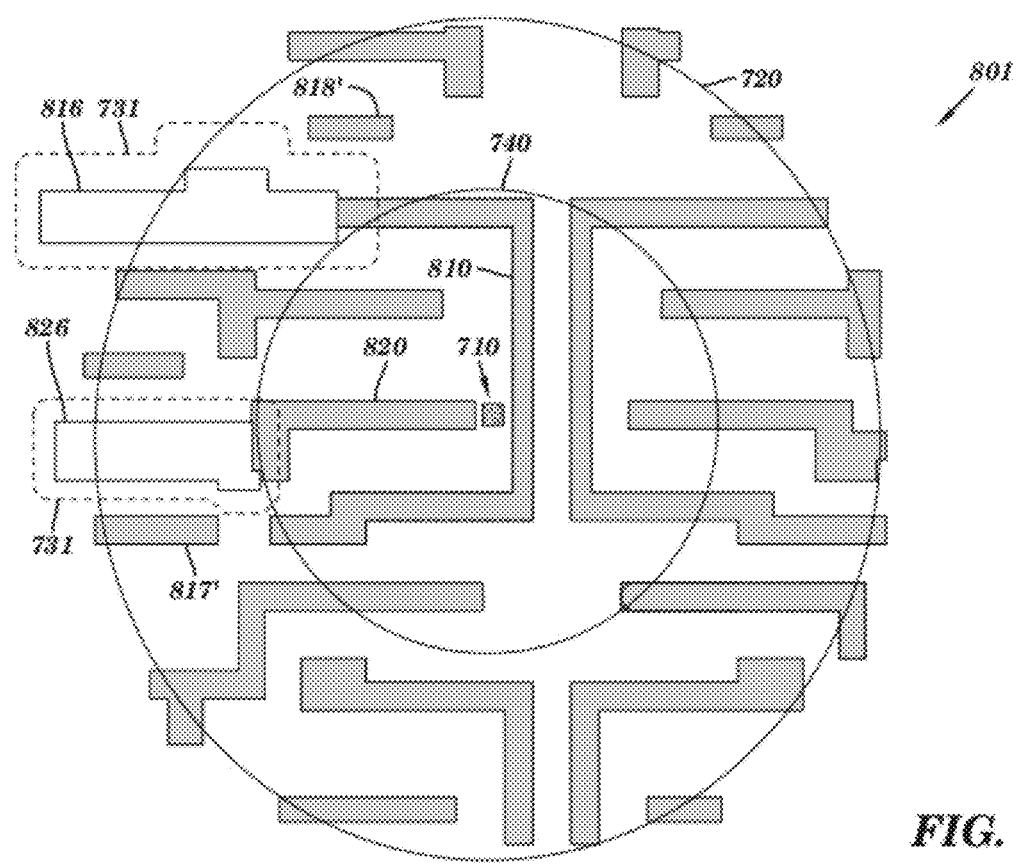
FIG. 13 illustrates an embodiment of an electrical test pattern formed in accordance with the invention based on the modified layout of FIG. 12.

In another embodiment, after trimming the features of FIG. 9 outside of the trim region 720, feed lines 816, 826 are provided outside of the ROI 740 that are outward biased versions of features 810, 820, respectively, resulting in the trimmed layout 800' illustrated in FIG. 12. Feed line trim regions 731 are defined at boundaries a minimum space distance from the edges of the biased feed lines 816, 826. In this example, neighboring features 817 and 818 are within the feed line trim regions 731. After trimming, portions of features 817, 818 are deleted, resulting in modified features 817' and 818'. The resulting electrical test pattern 801 is illustrated in FIG. 13.

Next, in one embodiment, the customized electrically testable patterns designed in accordance with the present invention may be used to characterize or monitor a manufacturing process, for example, to monitor tool and/or process stability, evaluate process changes, etc. The customized electrical test pattern may include features from other layers if appropriate for electrical testing. If the electrical test patterns yield 100%, then the process may be deemed stable and satisfactory, with a high degree of confidence, since the test patterns have been designed, in accordance with the invention, from the actual chip layout. However, if, over time, during several process steps, any one or more of the inventive electrical test patterns yield less than 100%, the process may need to be modified.

In another embodiment, the customized electrical test patterns designed in accordance with the invention may be used to calibrate a process model, for use in an OPC or in OPC Verification tool. For example, an electrical test pattern, based on a CD potential failure site, such as pattern 300 of FIG. 7, may be simulated by the process model to determine a yield metric, such as simulated CD, for a given set of process conditions and compared to the measured printed CD under those process conditions and the associated measured electrical data. The measured electrical data may be used as a yield metric. The yield metric may be correlated with a critical dimension in the layout that an OPC or OPC Verification tool is capable of identifying. For example, if the measured current does not meet a predetermined threshold, a yield failure is indicated. This may be true even though the simulated CD is above a rule-based minimum CD. In the case where the actual electrical yield is less than a threshold yield, e.g. 100%, but where the OPC Verification tool does not flag any failures, then a yield metric such as a CD failure limit may be changed so as to use the largest simulated CD at the critical site 210 that correlates with actual failures at the critical site 210 for an array of electrical test patterns designed in accordance with the invention, where each electrical test pattern of the array has a systematically varied nominal CD. Alternatively, the models and yield metrics or failure criteria used for OPC Verification may be adjusted or recalibrated so that simulated sites having yield parameters that correspond to actual failure sites will be flagged as errors by the OPC Verification rules.

Figure 14:
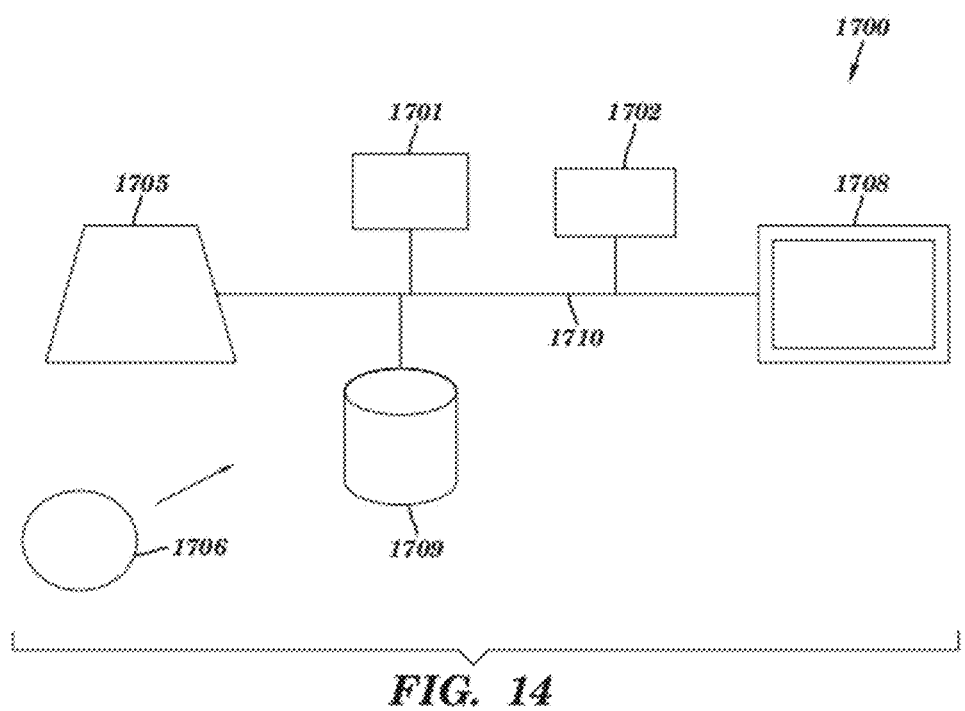
FIG. 14 illustrates an embodiment of the invention implemented in a computer program product.

In one embodiment of the present invention, referring to FIG. 14, the geometrical hierarchy may be incorporated into a design tool implemented in a digital computer 1700, having components including, but not limited to: a central processing unit (CPU) 1701, at least one input/output (I/O) device 1705 (such as a keyboard, a mouse, a compact disk (CD) drive, and the like), a display device 1708, a storage device 1709 capable of reading and/or writing computer readable code, and a memory 1702, all of which are connected, e.g., by a bus or a communications network 1710. The present invention may be implemented as a computer program product containing instructions stored on a computer readable medium, such as a tape or CD 1706, which may be, for example, read by the I/O device 1705, and stored in the storage device 1709 and/or the memory 1702. The computer program product contains instructions to cause a computer system to implement a method for designing an electrical test pattern in accordance with the present invention. The invention can take the form of an entirely hardware embodiment, and entirely software embodiment or an embodiment containing both hardware and software elements. In a preferred embodiment, the invention is implemented in a computer program product that contains instructions for executing method steps for designing the electrical test pattern, executable by a computer, which includes, but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus, device or element that can contain, store, communicate, propagate, or transport the program for use by or in connection with the computer or instruction execution system. The medium can be an electronic, magnetic, optical, electromagnetic, infrared, or semiconductor storage medium, network or propagation medium. Examples of a storage medium include a semiconductor memory, fixed storage disk, moveable floppy disk, magnetic tape, and an optical disk. Current examples of optical disks include compact disk-read only memory (CD-ROM), compact disk-read/write (CD-R/W) and digital video disk (DVD). The present invention also can be embedded in a computer program product or a propagated signal, which comprises all the respective features enabling the implementation of the methods described herein, and which—when loaded in a computer system—is able to carry out these methods. Computer program, propagated signal, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While the present invention has been particularly described, in conjunction with a specific preferred embodiment, it is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method of designing an electrical test pattern comprising the steps of:

providing a chip design comprising a chip layout of a first layer of features to be printed;
using a computer in identifying a critical site in said chip layout;
identifying at least one electrical test feature of said chip layout adjacent said critical site, said at least one electrical test feature having at least one electrical characteristic that will be significantly modified if a printing failure occurs at said critical site;
defining a region of influence (ROI) around said critical site such that printing of said critical site will not be influenced more than a predetermined critical site tolerance by the absence of features outside said ROI;
defining at least one feed line electrically connected to said at least one electrical test feature to enable testing of said at least one electrical characteristic;
defining a trim region outside of said ROI such that the absence any feature of said chip layout located outside of said trim region will not substantially, within a predetermined ROI tolerance, affect the printed dimensions of any feature within said ROI; and
deleting all features, other than said at least one feed line and said at least one electrical test feature, located outside of said trim region to form a customized electrical test pattern.

2. The method of claim 1, further comprising:
printing said customized electrical test pattern in accordance with a lithographic process to be used to print said chip layout;
electrically testing said printed customized electrical test pattern; and
if said at least one electrical characteristic fails a predetermined criterion, then modifying said lithographic process.

3. The method of claim 1, further comprising:
simulating a printing of said customized electrical test pattern in accordance with a process model of a lithographic process to be used to print said chip layout;
determining a yield metric for said lithographic process based on said simulated printed customized electrical test pattern;
printing said customized electrical test pattern in accordance with said lithographic process to be used to print said chip layout;
determining said yield metric based on said printed customized electrical test pattern; and
calibrating said process model based on a comparison between said printed and simulated yield metric.

4. The method of claim 3, wherein said yield metric is based on a correlation between a critical dimension in said printed electrical test pattern and said at least one electrical characteristic.

5. The method of claim 1, wherein said at least one feed line is located on a second electrical test feature in a second layer of features different than said chip layout, said second electrical test feature being electrically associated in said chip design with said at least one electrical test feature in said chip layout.

6. The method of claim 1, wherein said at least one feed line is a rectangular polygon located on said first layer and further comprising the steps of:
defining a feed trim region having a boundary greater than a minimum dimension outside of said at least one feed line; and
deleting any feature within said feed trim region other than said at least one feed line and said electrical test feature.

7. The method of claim 1, wherein said at least one feed line is located on said first layer and is defined by biasing a width of said at least one electrical test feature outside said ROI and further comprising the steps of:
defining a feed trim region having a boundary greater than a minimum dimension outside of said at least one feed line; and
deleting any feature within said feed trim region other than said at least one feed line and said electrical test feature.

8. The method of claim 1, further comprising, after said step of deleting, performing a cleanup of any remaining shapes that would violate any other mask design, inspection or manufacturability rules.

9. The method of claim 1, wherein said trim region is such that any dimension of any feature within said ROI will not vary by 5% with the presence or absence of any feature outside of said trim region.

10. The method of claim 1, wherein said step of deleting is performed such that any remaining features have a Manhattan geometry.

11. The method of claim 1, wherein said step of identifying a critical site in said chip layout is performed by processing said chip layout in an OPC verification tool.

12. The method of claim 1, wherein said critical site comprises a portion of a conductive line having a critical dimension.

13. The method of claim 1, wherein said at least one electrical characteristic comprises resistance.

14. The method of claim 1, wherein said critical site comprises a space between a first conductive line and a second conductive line.

15. The method of claim 1, further comprising modifying a dimension of said at least one electrical test feature within said ROI to form a second electrical test pattern.

16. A computer program product comprising a non-transitory computer storage medium including computer readable instructions wherein the computer readable instructions when executed on a computer system causes the computer system to perform the method steps of:
providing a chip design comprising a chip layout of a first layer of features to be printed;
identifying a critical site in said chip layout;
identifying at least one electrical test feature of said chip layout adjacent said critical site, said at least one electrical test feature having at least one electrical characteristic that will be significantly modified if a printing failure occurs at said critical site;
defining a region of influence (ROI) around said critical site such that printing of said critical site will not be influenced more than a predetermined critical site tolerance by the absence of features outside said ROI;
defining at least one feed line electrically connected to said at least one electrical test feature to enable testing of said at least one electrical characteristic;
defining a trim region outside of said ROI such that the absence any feature of said chip layout located outside of said trim region will not substantially, within a predetermined ROI tolerance, affect the printed dimensions of any feature within said ROI; and
deleting all features, other than said at least one feed line and said at least one electrical test feature, located outside of said trim region to form a customized electrical test pattern.

17. The computer program product of claim 16, the computer readable instructions further comprising instructions for performing the method steps of:

simulating a printing of said customized electrical test pattern in accordance with a process model of a lithographic process to be used to print said chip layout;

determining a yield metric for said lithographic process based on said simulated printed customized electrical test pattern;

providing said yield metric based on a printed customized electrical test pattern, printed in accordance with said lithographic process; and calibrating said process model based on a comparison between said printed and simulated yield metric.

18. The computer program product of claim 17, wherein said yield metric is based on a correlation between a critical dimension in said printed electrical test pattern and said at least one electrical characteristic.

19. The computer program product of claim 16, wherein said at least one feed line is located on a second electrical test feature in a second layer of features different than said chip layout, said second electrical test feature being electrically associated in said chip design with said at least one electrical test feature in said chip layout.

20. The computer program product of claim 16, wherein said at least one feed line is a rectangular polygon located on said first layer and further comprising the steps of:

defining a feed trim region having a boundary greater than a minimum dimension outside of said at least one feed line; and deleting any feature within said feed trim region other than said at least one feed line and said electrical test feature.

21. The computer program product of claim 16, wherein said at least one feed line is a rectangular polygon located on said first layer and further comprising the steps of:

defining a feed trim region having a boundary greater than a minimum dimension outside of said at least one feed line; and deleting any feature within said feed trim region other than said at least one feed line and said electrical test feature.

22. The computer program product of claim 16, further comprising, after said step of deleting, performing a cleanup of any remaining shapes that would violate any other mask design, inspection or manufacturability rules.

23. The computer program product of claim 16, wherein said trim region is such that any dimension of any feature within said ROI will not vary by 5% with the presence or absence of any feature outside of said trim region.

24. The computer program product of claim 16, wherein said step of deleting is performed such that any remaining features have a Manhattan geometry.

25. The computer program product of claim 16, wherein said step of identifying a critical site in said chip layout is performed by processing said chip layout in an OPC verification tool.

26. The computer program product of claim 16, wherein said critical site comprises a portion of a conductive line having a critical dimension.

27. The computer program product of claim 16, wherein said critical site comprises a space between a first conductive line and a second conductive line.

28. The computer program product of claim 16, wherein said at least one electrical characteristic comprises resistance.

29. The computer program product of claim 16, the computer readable instructions further comprising instructions for performing the method step of modifying a dimension of said at least one electrical test feature within said ROI to form a second electrical test pattern.

30. The computer program product of claim 16, the computer readable instructions further comprising instructions for extending said feed lines to connect to test pads.

* * * * *